United States Patent [19]

Fling

[11] Patent Number: 4,614,935

[45] Date of Patent: Sep. 30, 1986

[54] LOG AND ANTILOG FUNCTIONS FOR VIDEO BASEBAND PROCESSING

[75] Inventor: Russell T. Fling, Noblesville, Ind.

[73] Assignee: RCA Corporation, Princeton, N.J.

[21] Appl. No.: 685,679

[22] Filed: Dec. 24, 1984

[51] Int. Cl.[4] ............................................. H03M 5/00
[52] U.S. Cl. ............................................. 340/347 DD
[58] Field of Search ............... 340/347 DD; 364/757, 364/764

[56] References Cited

U.S. PATENT DOCUMENTS 3,877,026 4/1975 Wintz et al. ................. 340/347 DA
3,905,028 9/1975 Wintz et al. ................. 340/347 AD
4,555,768 11/1985 Lewis, Jr. et al. .................. 364/757

OTHER PUBLICATIONS

T. A. Brubaker et al., Multiplication Using Logarithms Implemented with Read-Only Memory, pp. 761-765.
J. N. Mitchell, Computer Multiplication and Division Using Binary Logarithms, pp. 512-517.
G. G. Apple et al., Log-Linear Companding-A Digital Companding Technique, pp. 1776-1777.
U.S. patent application Ser. No. 502,014 of Lewis, Jr. et al., Digital Signal Processing System Employing Logarithms to Multiply and Divide.

*Primary Examiner*—Bernard Roskoski
*Attorney, Agent, or Firm*—Paul J. Rasmussen; Eric P. Herrmann; Dilip A. Kulkarni

[57] ABSTRACT

The log encoder includes means for determining a number r corresponding to the position of the most significant one in the respective input samples, and generating an equivalent binary value. To the binary value is added a predetermined value when the input samples are non-zero to generate m-bit binary values representing the m most significant bits of the output samples in the log domain. The log encoder further includes means for generating l-bit binary values corresponding to the bits to the right of the most significant one in the input samples. The m-bit binary values are concatenated with the l-bit binary values as the most and least significant bits, which concatenated values represent the output samples in the log domain. The process is essentially reversed to convert the binary values in the log domain back into the non-log domain.

23 Claims, 6 Drawing Figures

LOG AND ANTILOG FUNCTIONS FOR VIDEO BASEBAND PROCESSING

The present invention relates to a digital signal encoding/decoding system for generating logarithms and antilogarithms for use in, for example, a digital television receiver.

In the processing of digital video signals, it often becomes necessary to perform multiplication and division operations, which may require digital multipliers and digital dividers. Most hardware-based direct multipliers operate using a series of shifting and adding operations in which the product is the result of a sequence of many such operations. Such hardware-based multipliers are undesirably complex and costly, especially where high-speed multiplication is required. Memory-based direct multipliers, on the other hand, operate using a table-look-up operation implemented with a read-only memory (ROM) which stores a table of values corresponding to the product of the digital numbers applied to it as addressing words. Because the number of bits which must be stored is very large, direct ROM-based multipliers also tend to be complex and costly.

One approach to reducing the require ROM storage capacity is to use logarithms to perform the multiplication and division operations. For example, to multiply, the logarithms of the multiplicand and of the multiplier are looked up in a ROM which stores a table of logarithms, and are added to produce the logarithm of the product. The antilogarithm of the product is then looked up in a second ROM which stores a table of antilogarithms. The division operation, on the other hand, requires subtraction of the respective logarithms to produce the logarithms of the quotient. The antilogarithm of the quotient is then looked up in another ROM containing antilogarithm values. Arrangements of the sorts described above are discussed, for example, in T. A. Brubaker et al., "MULTIPLICATION USING LOGARITHMS IMPLEMENTED WITH READ-ONLY MEMORY", *IEEE Transactions on Computers*, Volume C-24, No. 8, August 1975, pages 761–65.

A disadvantage of the above type of logarithmic processing using ROMs is that the number of bits in the logarithm have to be relatively large in order to obtain adequate resolution. To achieve equivalent results using log processing, for example, a 7-bit binary number should be coded to at least 9-bit logarithms. This means that the ROM containing the log table would require 1,152 bits (i.e., $2^7 \times 9$). The antilog table requires even more ROM —3,584 bits (i.e., $2^9 \times 7$). It will be noted that the amount of ROM required increases exponentially with the word size.

Thus, there is a need for a multiplication and division system which will reduce the number of bits of the logarithm so as to decrease the size of the memories required to achieve a given level of accuracy or, alternately, which will improve the accuracy of the product obtainable with a given number of bits in the logarithm.

U.S. patent application, Ser. No. 502,014, of Lewis, Jr. et al., and entitled "DIGITAL SIGNAL PROCESSING SYSTEM EMPLOYING LOGARITHMS TO MULTIPLY AND DIVIDE", now U.S. Pat. No. 4,555,768 describes one such system. The logarithmic processing system of Lewis, Jr. et al. comprises a first memory producing N-bit logarithms to a base B of M-bit binary input numbers to be processed. A second memory produces the antilogarithm to the base B of the sum of the logarithms. The base B is selected to utilize substantially the entire range of possible magnitudes of the N-bit logarithms. Specifically, the base B to which the logarithms are taken is given by the equation:

$$B = \text{antilog}_{10}[2/(2N-1) \log_{10}(2M-1)].$$

The aforesaid approaches used for logarithmic processing are based on storage of tables of logarithms and antilogarithms in ROMs. For certain applications, it may be advantageous to calculate approximate logarithms without lookup tables prior to transmission or processing, and then to convert the output numbers back into binary values in the non-log domain A method of calculating approximate logarithms to the base two has been described in an article in IRE Transactions on Electronic Computers, Volume EC-11, pages 512–517, August 1962, by J. N. Mitchell, Jr., and entitled "COMPUTER MULTIPLICATION AND DIVISION USING BINARY LOGARITHMS". Basically, this method uses the bit position of the most significant one to define the characteristic of the logarithm, and uses the bits to the right of the most significant one to define the mantissa thereof.

In an article, entitled "LOG-LINEAR COMPANDING-A DIGITAL COMPANDING TECHNIQUE", in *Proceedings of the IEEE*, October 1969, pages 1776–1777, Apple, Jr., discloses a digital companding technique. In the therein disclosed scheme, binary numbers go through a log-linear encoder and then to the transmission channel. At the receiver, a log-linear decoder reconstructs the original samples in the non-log domain. The log-linear encoder transmits the bit position of the most significant one by assigning a three-digit binary number to the indicated position. If no logical 1 is observed in the input numbers, then three zeros are transmitted. The three bits defining the position of the most significant one (or the lack thereof) in the input numbers form the three most significant bits of the output numbers in the log domain. The trailing bits following the most significant one in the input numbers constitute the least significant bits of the output numbers. The process is reversed in the log decoder to reconstruct the original samples in the non-log domain.

The logarithm and antilogarithm calculating circuitry, in accordance with this invention, is an improvement over the aforementioned techniques disclosed by Mitchell, Jr. and Apple, Jr. According to one feature of the invention, the log encoder includes a selectively-actuated means for adding a fixed binary value to the set of binary numbers defining the bit position of the most significant one in the binary input numbers when the input numbers are non-zero. The selectively-actuated adding means are disabled when the input numbers are zero.

The selectively-actuated adding means of this invention allows separation of the output numbers defining the logarithms of the non-zero input numbers from the output numbers representing the logarithms of the input numbers which are zero. This produces logarithmic values which more accurately reflect the actual logarithms.

Pursuant to a further feature of the invention, the log encoder includes a log fixup means, which in response to the trailing bits following the most significant one in the input numbers, corrects for the differences between the actual log function and the log-linear approximation thereof.

The log decoder, according to a still further feature of the invention, includes a truncation fixup ROM, which in response to the most significant bits of the output numbers in the log domain (defining the bit position of the most significant one in the respective input numbers) adds correction factors to the output numbers, so that the reconstructed samples are rounded off to the nearest integer.

In the DRAWINGS, line arrows represent signal paths for analog signals or for single bit digital signals, and line arrows having slash marks represent signal paths for multiple-bit parallel digital signals, with the number of bits thereof indicated by a numeral or legend proximate to the slash mark.

Figure 1:
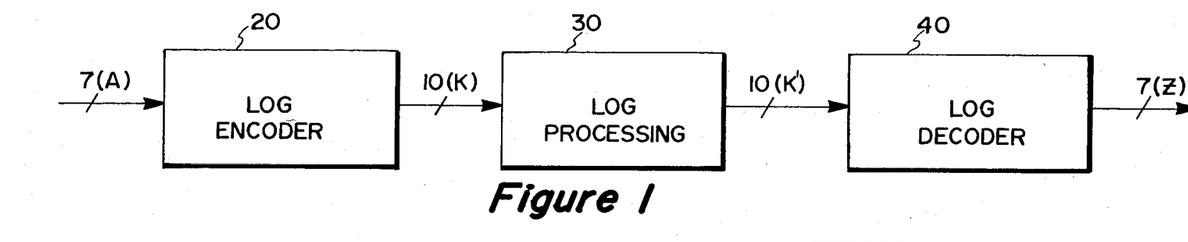
FIG. 1 in the block diagram form, the overall system log encoder and decoder of the present invention

FIG. 1 schematically represents a log processor, which may be a digital gain stage for applying gain to, for example, the digital baseband video signal in a digital television receiver. In FIG. 1, the 7 bit binary samples of the baseband video signal are fed to a log encoder 20, which computes 10 bit logarithms of the input numbers in accordance with this invention. The output numbers in the log domain are processed in the required manner, as indicated by the block 30. The log processing might, for example, comprise of multiplications and divisions corresponding to the gain or attenuation functions. The 10-bit processed numbers in the log domain are translated back into the non-log domain by a log decoder 40, also pursuant to this invention, to generate at the output thereof 7-bit reconstructed samples.

Figure 2:
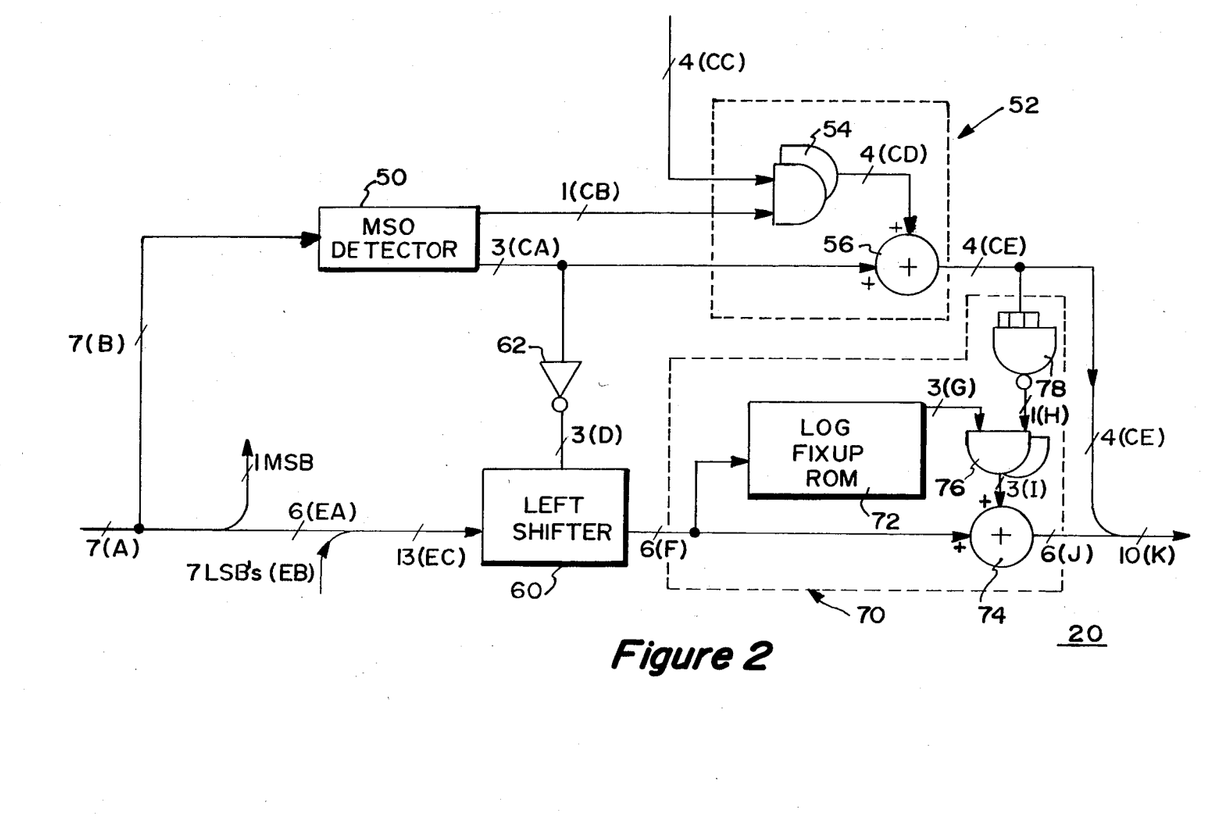
FIGS. 2 and 3 illustrate detailed block diagrams of the subject log encoder and decoder respectively.

FIG. 2 illustrates a detailed block diagram of the instant log encoder 20. The 7-bit binary input samples are fed to a detector 50, which detects the bit position of the most significant "one" in the input numbers. A 3-bit first output CA of the detector 50 varies from 1 to 7 as the position of the most significant one in the input samples changes from the rightmost position to the leftmost position respectively. The detector 50 outputs three zeros on the line CA, when no logical one is present in the input samples (i.e., when the input samples are zero).

A 1-bit second output CB of the detector 50 is a logical one when the input samples are non-zero, and is a logical zero otherwise. The second output CB is coupled to a selectively-actuated adding means 52. The selectively-actuated adding means 52 adds a fixed binary value CC (e.g., 1000) to the first output CA of the detector 50 when the input samples A are non-zero. Although the fixed binary value CC in this particular embodiment is selected to be 1000, any other suitable fixed binary value may be added to the first output CA of the bit position detector 50. The selectively-actuated adding means 52 is disabled when the input samples A are zero.

The selectively-actuated adding means 52 comprises a plurality of four AND gates 54, and an adder 56. Each of the AND gates 54 has a first input coupled for receiving the respective one of the bits CC defining the fixed binary value 1000, and a second input coupled for receiving the second output CB of the detector 50. The AND gates 54 have at their output CD the fixed binary value 1000 when the input samples are non-zero, and four zeros otherwise.

The output of the AND gates 54 is combined with the first output CA of the detector 50 in the adder 56 to generate at the output CE thereof a set of 4 bits, which are associated with the bit position of the most significant one in the input samples A, and which define the 4 most significant bits of the output samples in the log domain on the output line K of the log encoder 20.

The bits to the right of the leftmost logical one in the input samples define a plurality of bits associated with the least significant bits of the output samples K in the log domain. The 6 least significant bits EA of the input samples A are supplied to the bit shifter 60. The bit shifter 60 shifter the 6 least significant bits EA of the input samples A to the left until the most significant one is displaced out of the shifter to generate on the output line F thereof the 6 bits associated with the least significant bits of the output samples K. In other words, the bit shifter 60 produces a 6-bit output word, in which the most significant bits consist of the lesser significant bits occurring to the right of the most significant logical one of the input word, and in which the remaining least significant bits of the 6-bit output word are logical zeros. In this embodiment, a switching matrix shifter is used to produce the required bit shifts. However, any other suitable device—such as a shift register—may be employed instead.

An inverter 62 complements the first output CA of the bit position detector 50 to generate a value defining the number of shifts to the left necessary for transferring the most significant one off the left end of the 6 least significant bits of the 7-bit input samples. The output D of the inverter 62 is applied to the bit shifter 60 to produce the desired number of shifts to, in turn, generate the 6 least significant bits F.

The output of the bit shifter 60 can be merged directly with the output CE of the selectively-actuated adding means 52 as the least and most significant bits respectively of the output samples to generate a log-linear approximation of the actual log function. In the Cartesian coordinate system, the log linear (or piecewise) approximation consists of replacing the base two log curve with a series of straight lines connecting the points on the log curve where the log function has integer values.

It will be noted that the log-linear approximation is exact for input numbers which are integer powers of two. In between, the log-linear approach will result in the log values which are slightly smaller than the actual log values.

The output K of the log decoder 20 is made more precise by employing a log fixup means 70 for correcting the 6 bits F at the output of the bit shifter 60 for the differences between the log-linear approximation and the ideal log curve. The log fixup means 70 includes a ROM 72 which has as input the 6 bit output F of the bit shifter 60, and which is programmed to contain the respective error values G representing the associated differences between the log-linear approximation and the actual log curve.

A listing of the error values G stored in the log fixup ROM for the specific circuit shown in FIG. 2 is illustrated in TABLE 1. The address values F'+1 are applied to the ROM 72. The values in the column headed by F'+1 are the respective error values provided by the ROM 72. For example, the error value of 6 for F=28 is found at the intersection of the row 4 and the column 28

(i.e., 24+4). It is noted that the error values G are independent of the 4 most significant bits CE of the output samples K, and that the error values depend only on the value of the 6 least significant bits at the output F of the left shifter 60.

TABLE 1

| | LOG FIXUP ROM(G) | | | | | | | |
|---|---|---|---|---|---|---|---|---|
| Address F | F'+0 | F'+1 | F'+2 | F'+3 | F'+4 | F'+5 | F'+6 | F'+7 |
| F'=0 | 0 | 0 | 1 | 1 | 2 | 2 | 2 | 3 |
| 8 | 3 | 3 | 3 | 4 | 4 | 4 | 4 | 4 |
| 16 | 5 | 5 | 5 | 5 | 5 | 5 | 5 | 5 |
| 24 | 5 | 5 | 5 | 5 | 6 | 6 | 5 | 5 |
| 32 | 5 | 5 | 5 | 5 | 5 | 5 | 5 | 5 |
| 40 | 5 | 5 | 5 | 4 | 4 | 4 | 4 | 4 |
| 48 | 4 | 3 | 3 | 3 | 3 | 3 | 2 | 2 |
| 56 | 2 | 2 | 2 | 1 | 1 | 1 | 1 | 0 |

The log fixup means 70 further includes an adder 74, which selectively combines the 6-bit output F of the left shifter 60 with the respective error values G stored in the ROM 72 to produce on the output line J thereof the 6 log-corrected least significant bits. The 4-bit scaled binary numbers on the line CE are then combined with the 6-bit log-corrected binary numbers as the most and least significant bits, respectively, of the log-corrected output samples on the line K of the log encoder 20.

In the very last segment of the log scale (i.e., CE=1111), it is desirable to set the error values to zero to avoid adjacent input numbers from having the same log values. This allows the differentiation of the output values in the last segment of the log scale. To this end, the log fixup means 70 includes a plurality of AND gates 76, each of which has as a first input the respective bits of the binary representation of the error values G, and which has as a second input a 1-bit value which is set equal to zero when the 4 most significant bits CE of the output samples K are all logical ones—indicating the presence of the very last segment of the log scale. The second input of the AND gates 76 is derived from a 4-input NAND gate 78 as depicted in FIG. 2. The output of the AND gates 76 is thus set equal to zero, when the NAND gate 78 senses the presence of 4 one's on its input lines.

Instead of storing the error values in the log fixup ROM 72, one may store the final 6-bit log-corrected to be larger to accommodate the actual values (up to 6 bits) rather than the error values (up to 3 bits).

It will be noted that a ROM containing the error values (i.e., $2^6 \times 3 = 192$ bits) will be much smaller than a ROM containing a log table (i.e, $2^7 \times 9 = 1,152$ bits), which would be required for the ROM-only approach to log processing. On the other hand, a ROM containing the full log-corrected values of the 6 least significant bits of the output samples will require 384 bits of storage (i.e., $2^6 \times 6$). As will be clear from the foregoing, the reduction in the ROM storage capacity with the subject approach is substantial.

A representative sample of the operation of the log encoder 20 is illustrated in TABLE 2 given on the next page. The column headings A, B, C, etc. refer to the appropriate lines in FIG. 2.

Figure 3:
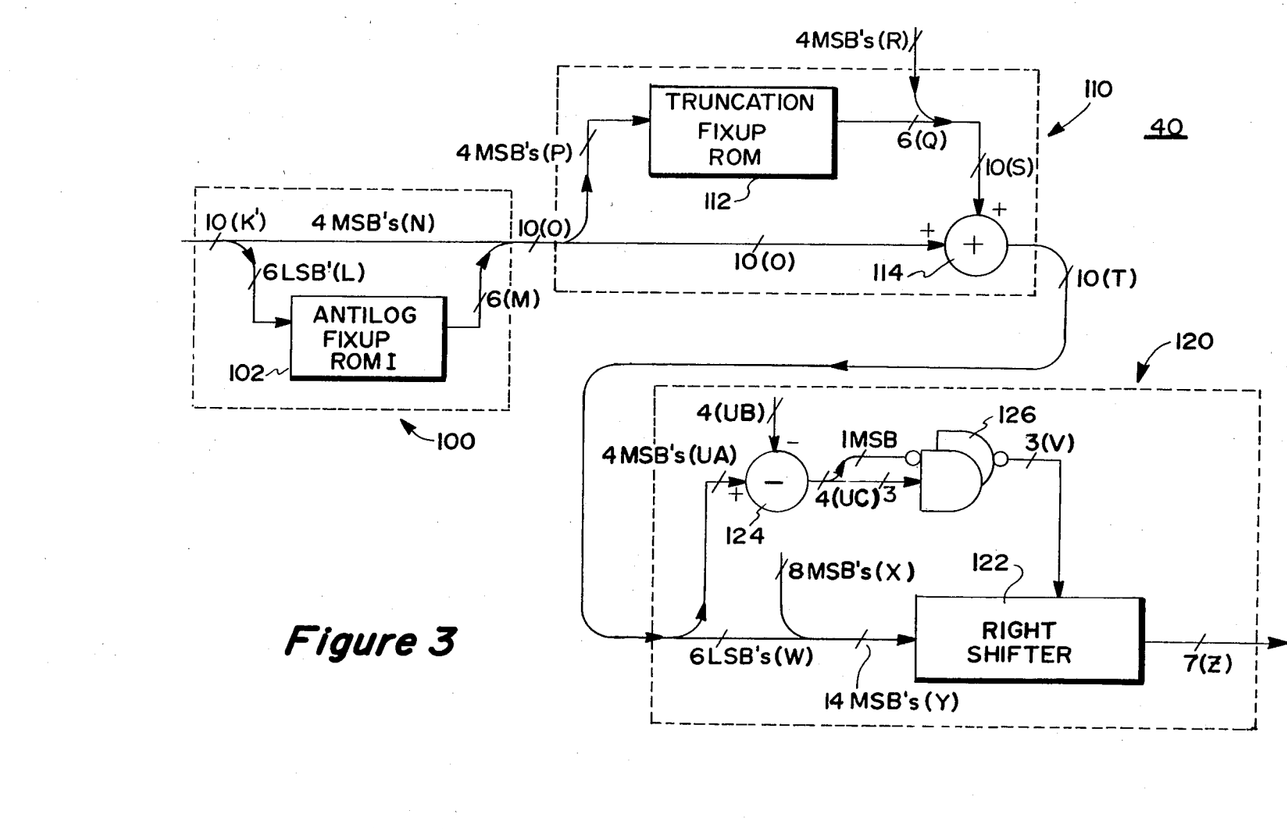

After the processing of the output samples K in the log domain (e.g., multiplication, etc.), the processed output samples K' are fed to the log decoder 40 to reconstruct the respective 7-bit binary samples in the original non-log domain. Basically, the operation of the log decoder 40, shown in FIG. 3, is the reverse of the operation of the log encoder 20 of FIG. 2.

The antilog fixup means 100 modifies the 6 log-corrected least significant bits L of the processed output samples K' to generate the log-linear output samples O at its output. The truncation fixup means 110, responsive to the 4 most significant bits P of the output O of the antilog fixup means 100, adds the respective correction factors to the associated output to minimize the truncation errors. This assures that the reconstructed samples Z are rounded off to the nearest integer. The shifting means 120 produces the desired

TABLE 2

| | | | | | | | | | | | | | LOG ENCODER(K) | |
|---|---|---|---|---|---|---|---|---|---|---|---|---|---|---|
| SAMPLE | INPUT A | | | | | | | | | | | | OUTPUT K | |
| NUMBER | DECIMAL | BINARY | CA | CB | CD | CE | D=$\overline{CA}$ | F | G | H | I | J=F+I | BINARY | DECIMAL |
| 1 | 0 | 0 000 000 | 000 | 0 | 0 000 | 0 000 | 111 | 000 000 | 000 | 1 | 000 | 000 000 | 0 000 000 000 | 0 |
| 2 | 1 | 0 000 001 | 001 | 1 | 1 000 | 1 001 | 110 | 000 000 | 000 | 1 | 000 | 000 000 | 1 001 000 000 | 576 |
| 3 | 2 | 0 000 010 | 010 | 1 | 1 000 | 1 010 | 101 | 000 000 | 000 | 1 | 000 | 000 000 | 0 010 000 000 | 640 |
| 4 | 3 | 0 000 011 | 010 | 1 | 1 000 | 1 010 | 101 | 100 000 | 101 | 1 | 101 | 100 101 | 1 010 100 101 | 677 |
| 5 | 4 | 0 000 100 | 011 | 1 | 1 000 | 1 011 | 100 | 000 000 | 000 | 1 | 000 | 000 000 | 1 011 000 000 | 704 |
| 6 | 5 | 0 000 101 | 011 | 1 | 1 000 | 1 011 | 100 | 010 000 | 101 | 1 | 101 | 010 101 | 1 011 010 101 | 725 |
| 7 | 6 | 0 000 110 | 011 | 1 | 1 000 | 1 011 | 100 | 100 000 | 101 | 1 | 101 | 100 101 | 1 011 100 101 | 741 |
| 8 | 7 | 0 000 111 | 011 | 1 | 1 000 | 1 011 | 100 | 110 000 | 100 | 1 | 100 | 110 100 | 1 011 110 100 | 756 |
| 9 | 8 | 0 001 000 | 100 | 1 | 1 000 | 1 100 | 011 | 000 000 | 000 | 1 | 000 | 000 000 | 1 100 000 000 | 768 |
| 10 | 16 | 0 010 000 | 101 | 1 | 1 000 | 1 101 | 010 | 000 000 | 000 | 1 | 000 | 000 000 | 1 101 000 000 | 832 |
| 11 | 32 | 0 100 000 | 110 | 1 | 1 000 | 1 110 | 001 | 000 000 | 000 | 1 | 000 | 000 000 | 1 110 000 000 | 896 |
| 12 | 64 | 1 000 000 | 111 | 1 | 1 000 | 1 111 | 000 | 000 000 | 000 | 0 | 000 | 000 000 | 1 111 000 000 | 960 |
| 13 | 127 | 1 111 111 | 111 | 1 | 1 000 | 1 111 | 000 | 111 111 | 000 | 0 | 000 | 111 111 | 1 111 111 111 | 1063 | values therein. An advantage of storing the corrected values in the log fixup ROM 72 is that the adder 74 can be eliminated. A disadvantage of this configuration, on the other hand, is that the log fixup ROM 72 will have number of right shifts of the binary numbers Y at its input to generate the 7 bit reconstructed samples in the original, non-log domain on the output line Z of the log decoder 40.

Further details of the operation of the log decoder 40 will now be discussed. The 6 least significant bits L of the processed output samples K' are applied to an antilog fixup ROM 102, which is programmed to contain the corresponding log-linear values M. The 6-bit output M of the antilog fixup ROM 102 is merged with the 4 most significant bits on the line N to generate the associated 10-bit binary values on the line 0.

A listing of the log-linear values M stored in the antilog fixup ROM 102 for the specific circuit given in FIG. 3 is shown below in TABLE 3.

TABLE 3

| Address L | ANTILOG FIXUP ROM(M) | | | | | | | |
|---|---|---|---|---|---|---|---|---|
| | L'+0 | L'+1 | L'+2 | L'+3 | L'+4 | L'+5 | L'+6 | L'+7 |
| L'=0 | 0 | 1 | 1 | 2 | 2 | 3 | 4 | 4 |
| 8 | 5 | 6 | 7 | 7 | 8 | 9 | 10 | 11 |
| 16 | 11 | 12 | 13 | 14 | 15 | 16 | 17 | 18 |
| 24 | 19 | 20 | 21 | 22 | 22 | 23 | 25 | 26 |
| 32 | 27 | 28 | 29 | 30 | 31 | 32 | 33 | 34 |
| 40 | 35 | 36 | 37 | 39 | 40 | 41 | 42 | 43 |
| 48 | 44 | 46 | 47 | 48 | 49 | 50 | 52 | 53 |
| 56 | 54 | 55 | 56 | 58 | 59 | 60 | 61 | 63 |

The 4 most significant bits of the binary values O are fed to a truncation fixup ROM 112, which is programmed to contain the respective correction factors. A 4-bit code R,0000, is appended as the most significant bits to the 6 bit binary representation Q of the correction factors to form a 10-bit result S, which is combined with the corresponding binary values O in the adder 114. As previously indicated, the truncation fixup means 110 assures that the 7-bit reconstructed samples Z are rounded off to the nearest integer.

A listing of the correction factors Q stored in the truncation fixup ROM 112 for the specific circuit shown in FIG. 3 is given below in TABLE 4.

TABLE 4

| | TRUNCATION FIXUP ROM(Q) | | | |
|---|---|---|---|---|
| Address P | P'+0 | P'+1 | P'+2 | P'+3 |
| P'=8 | 63 | 32 | 16 | 8 |
| 12 | 4 | 2 | 1 | 0 |

An 8-bit code X, 00 000 001, is appended as the most significant bits to the 6 least significant bits W of the 10 bit binary values T at the output of the adder 114 to form a 14 bit result Y, which is fed to a bit shifter 122. Basically, this step serves to reinsert a logical one to the left of the 6 least significant bits W of the binary values T at the output of the adder 114. The bit shifter 122 produces the desired right shifts of the binary values Y at the input thereof to generate the respective 7-bit reconstructed samples Z at its output. The role of the bit shifter 122 in the log decoder 40 is essentially the reverse of the role of the bit shifter 60 in the log encoder 20.

To determine the desired number of right shifts V, the 4 most significant bits UA of the 10-bit binary values T are applied to a subtracter 124, which subtracts the fixed binary value UB (1000) therefrom. It will be observed that the role of the subtracter 124 in the log decoder 40 is the opposite to that of the adder 114 in the log encoder 20. The inverted value of the most significant bit at the output UC of the subtracter 124 is applied as the first input to each one of a plurality of 3 NAND gates 126. Furthermore, each of the NAND gates 126 receives as the second input the respective one of the remaining 3 bits of the subtracter output UC. The 3-bit output V of the NAND gates 126 is applied to the bit shifter 122 to produce the required number of right shifts of the 14-bit binary values Y to generate the 7-bit reconstructed samples on the line Z of the log decoder 40.

It is further noted that the application of the inverted value of the most significant bit of the subtracter's output UC serves to produce 3 logical ones at the output V of the NAND gates 126, when the input samples A are zero. Otherwise, the NAND gates 126 simply invert the 3 least significant bits of the subtracter's output UC. Essentially, the process used for generating the value V representing the number of right shifts required in the log decoder 40 is inverse of the process used to produce the value D defining the number of left shifts desired in the log encoder 20.

A representative sample of the operation of the log decoder 40 is shown in TABLE 5. Again, the column headings K', L, M, etc. designate the respective lines in FIG. 3.

As previously indicated, the truncation fixup means 110 serves to round off the reconstructed samples Z in the original, non-log domain to the nearest integer. The operation of the truncation fixup means 110 will be clear from TABLE 5. When the input to the log decoder 40 in the log domain corresponds to a value of 3.75 in the non-log domain (Sample No. 4, TABLE 5), the decoder outputs a value of 4—i.e., the nearest integer. Without the truncation fixup means 110, the log decoder 40 would have truncated the output to a value of 3. Furthermore, when the input to the log decoder 40 in the log domain corresponds to a value of 4.25 in the non-log domain (Sample No. 6, TABLE 5), the decoder generates a value of 4—again the nearest integer.

Figure 4:
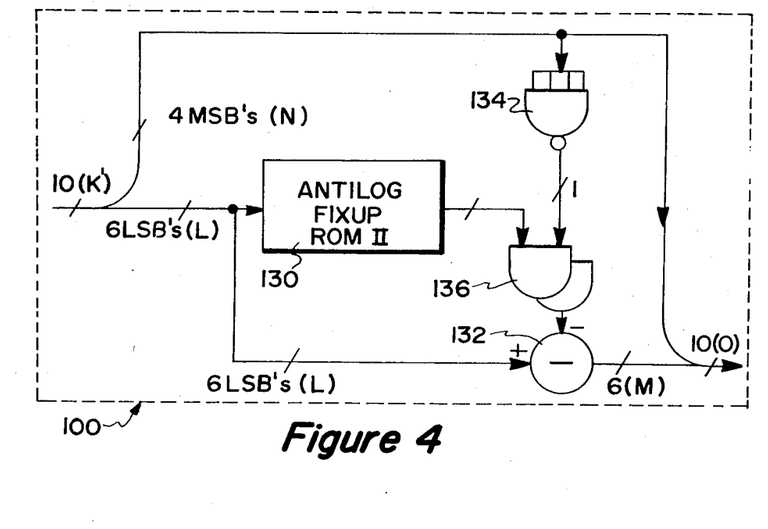
FIGS. 4–6 depict alternative ways of implementing certain portions of the log decoder of FIG. 3.
Figure 5:
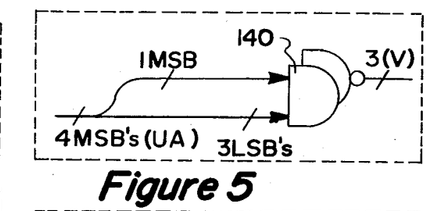
Figure 6:
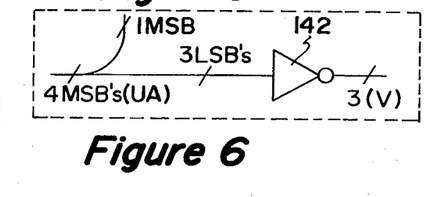

FIGS. 4-6 show certain modifications to the log decoder 40 of FIG. 3. FIG. 4 depicts an alternative version of the antilog fixup means 100. Two alternative arrangements for the circuitry used to generate the number of required right shifts V are respectively depicted in FIGS. 5 and 6.

In the FIG. 4 arrangement, the error values reflecting the differences between the actual log curve and the log-linear approximation thereof are stored in an antilog fixup ROM 130.

TABLE 5

| SAMPLE NUMBER | ENCODER INPUT A | DECODER LOG INPUT K' | | LOG DECODER (Z) | | | | | |
|---|---|---|---|---|---|---|---|---|---|
| | | BINARY | DECIMAL | L | M | O | P | Q | S |
| 1 | 0 | 0 000 000 000 | 0 | 000 000 000 000 | 0 000 000 000 | 0 000 000 000 | 0 000 000 000 |

TABLE 5-continued

| | | | | LOG DECODER (Z) | | | | |
|---|---|---|---|---|---|---|---|---|
| 2 | 1 | 1 001 000 000 | 576 | 000 000 000 000 | 1 001 000 000 | 1 001 100 000 | 0 000 100 000 | |
| 3 | 2 | 1 010 000 000 | 640 | 000 000 000 000 | 1 010 000 000 | 1 010 010 000 | 0 000 010 000 | |
| 4 | 3.75 | 1 010 111 010 | 698 | 111 010 111 000 | 1 010 111 000 | 1 010 010 000 | 0 000 010 000 | |
| 5 | 4 | 1 011 000 000 | 704 | 000 000 000 000 | 1 011 000 000 | 1 011 001 000 | 0 000 001 000 | |
| 6 | 4.25 | 1 011 000 110 | 710 | 000 110 000 100 | 1 011 000 100 | 1 011 001 000 | 0 000 001 000 | |
| 7 | 8 | 1 100 000 000 | 768 | 000 000 000 000 | 1 100 000 000 | 1 100 000 100 | 0 000 000 100 | |
| 8 | 16 | 1 101 000 000 | 832 | 000 000 000 000 | 1 101 000 000 | 1 101 000 010 | 0 000 000 010 | |
| 9 | 32 | 1 110 000 000 | 896 | 000 000 000 000 | 1 110 000 000 | 1 110 000 001 | 0 000 000 001 | |
| 10 | 64 | 1 111 000 000 | 960 | 000 000 000 000 | 1 111 000 000 | 1 111 000 000 | 0 000 000 000 | |
| 11 | 127 | 1 111 111 111 | 1023 | 111 111 111 111 | 1 111 111 111 | 1 111 000 000 | 0 000 000 000 | |

| SAMPLE NUMBER | ENCODER INPUT A | T=O+S | UA | UC | V | W | Y | Z BINARY | Z DECIMAL |
|---|---|---|---|---|---|---|---|---|---|
| 1 | 0 | 0 000 000 000 | 0 000 | 1 000 | 111 | 000 000 | 00 000 001 000 000 | 0 000 000 | 0 |
| 2 | 1 | 1 001 100 000 | 1 001 | 0 001 | 110 | 100 000 | 00 000 001 100 000 | 0 000 001 | 1 |
| 3 | 2 | 1 010 010 000 | 1 010 | 0 010 | 101 | 010 000 | 00 000 001 010 000 | 0 000 010 | 2 |
| 4 | 3.75 | 1 011 001 000 | 1 011 | 0 011 | 100 | 001 000 | 00 000 001 001 000 | 0 000 100 | 4 |
| 5 | 4 | 1 011 001 000 | 1 011 | 0 011 | 100 | 001 000 | 00 000 001 001 000 | 0 000 100 | 4 |
| 6 | 4.25 | 1 011 001 000 | 1 011 | 0 011 | 100 | 001 000 | 00 000 001 001 000 | 0 000 100 | 4 |
| 7 | 8 | 1 100 000 100 | 1 100 | 0 100 | 011 | 000 100 | 00 000 001 000 100 | 0 001 000 | 8 |
| 8 | 16 | 1 101 000 010 | 1 101 | 0 101 | 010 | 000 010 | 00 000 001 000 010 | 0 010 000 | 16 |
| 9 | 32 | 1 110 000 001 | 1 110 | 0 110 | 001 | 000 001 | 00 000 001 000 001 | 0 100 000 | 32 |
| 10 | 64 | 1 111 000 000 | 1 111 | 0 111 | 000 | 000 000 | 00 000 001 000 000 | 1 000 000 | 64 |
| 11 | 127 | 1 111 111 111 | 1 111 | 0 111 | 000 | 111 111 | 00 000 001 111 111 | 1 111 111 | 127 |

The error valves at the output of the ROM 130 are subtracted from the 6 least significant bits L of the output samples K' in the subtracter 132 to generate the 6 bit values M corresponding to the log-linear approximation. A 4-input NAND gate 134, responsive to the 4 MSB's of the output samples K', disables a plurality of AND gates 136 when the log decoder 40 is operating in the very last segment of the log scale, whereby the output of the antilog fixup ROM 130 is set to zero. The operation of the antilog fixup means 100 of FIG. 4 is similar to that of the log fixup means 70 in FIG. 2.

The circuit arrangement of FIG. 3 employed for generating the desired number of right shifts V can be simplified in the manner portrayed in FIG. 5. The leftmost bit of the 4 most significant bits UA of the binary numbers T at the output of the adder 114 is fed directly to each one of a plurality of NAND gates 140 at the first input. Additionally, each one of the NAND gates 140 receives as the second input the respective one of the remaining 3 bits of the 4 most significant bits UA. The output of the NAND gates 140 is applied to the bit shifter 122.

FIG. 6 shows another arrangement for generating the number of right shifts V. In this arrangement, an inverter 142 simply inverts the 3 rightmost bits of the 4 most significant bits UA of the binary numbers T at the output of the adder 114. The output of the FIG. 6 circuitry is fed to the bit shifter 122.

The present invention provides a log encoding/decoding system which is accurate and cost-effective.

What is claimed is:

1. A digital signal processing apparatus for encoding n-bit binary input samples to produce m+1 bit binary output samples representative of a given logarithmic function of said input samples; each of said binary input samples being represented by n binary bits arranged in order of significance from a least significant bit position to a most significant bit position; each of said binary output samples being represented by m+1 binary bits arranged in order of significance from a least significant bit position to a most significant bit position; each of said bits exhibiting first and second states representing logical one's and logical zero's respectively; said encoding apparatus comprising:

(A) an input terminal for applying said n-bit binary input samples;
(B) means, coupled to said input terminal, for determining the bit position of highest significance exhibiting a logical one state in the respective one of said input samples to produce at an output thereof a first set of binary numbers corresponding to said bit position of highest significance;
(C) selectively-actuated means, coupled to said bit position determining means, for adding a fixed binary value to said first set of numbers when said input samples are non-zero to produce a second set of binary numbers corresponding to the m most significant bits of said m+1 bit output samples;
(D) means including means, coupled to said input terminal, for generating a third set of binary numbers corresponding to the bits of lesser significance than said bit position of highest significance in said input samples; said third set of binary numbers corresponding to the l least significant bits of said m+1 bit output samples; and
(E) means, coupled to said selectively-actuated means and to said means for generating said third set of binary numbers, for concatenating said second and third sets of binary numbers to produce said m+1 bit output samples representing alog-linear approximation of said given logarithmic function.

2. The encoding apparatus as defined in claim 1 wherein said selectively-actuated adding means comprises a plurality of AND gates, each (a) having a first input coupled for receiving the respective one of the bits of said fixed binary value, and (b) having a second input which is a logical one when said input samples are nonzero and a logical zero otherwise.

3. The encoding apparatus as defined in claim 2 wherein the second inputs of said AND gates are derived from said bit position determining means.

4. The encoding apparatus as defined in claim 2 wherein said selectively-actuated adding means further includes means for combining said first set of numbers with said output of said AND gates to produce at the output thereof said second set of binary numbers representative of the m most significant bits of said output samples.

5. The encoding apparatus as defined in claim 1 wherein said means for generating said third set of binary numbers comprises means coupled to said input terminal and to said bit position determining means for shifting said input samples toward the position of higher significance until said highest significance bit exhibiting a logical one state is displaced out of said shifting means to produce at an output thereof said third set of binary numbers associated with the said l least significant bits of said m+1 bit output samples.

6. The encoding apparatus as defined in claim 5 wherein said first set of binary numbers at said output of said bit position determining means vary from 1 to n as said highest significance bit exhibiting a logical one state in said input samples shifts from said least significant bit position position to said most significant bit position position respectively; wherein said output of said bit position determining means is zero in the absence of a logical one in said input samples.

7. The encoding apparatus as defined in claim 6 further including means for inverting said first set of binary numbers to produce at an output thereof a value defining the number of shifts toward the position of higher significance necessary for transferring out said highest significance bit exhibiting a logical one state from the n−1 least significant bits of said n-bit input samples; said output of said inverting means being applied to said shifting means to generate said third set of numbrrs associated with the said l least significant bits of said m+1 bit log-linear output samples.

8. The encoding apparatus as defined in claim 7 wherein said means for generating said third set of binary numbers further includes a log fixup means responsive to said l least significant bits at said output of said shifting means for correcting said least significant bits for the differences between said log-linear approximation and said given logarithmic function to produce a fourth set of binary numbers defining the l log-corrected least significant bits; said concatenating means merging said m-bit second set of most significant bits with said l-bit fourth set of log-corrected least significant bits to produce m+1 bit log-corrected output samples more accurately defining said given logarithmic function.

9. The encoding apparatus as defined in claim 8 wherein said log fixup means includes a ROM which produces at the output thereof binary correction numbers corresponding to the respective differences between said log-linear approximation and said given logarithmic function in response to said third set of uncorrected least significant bits applied thereto as address codes; said log fixup means additionally having means for combining said third set of uncorrected least significant bits with said correction numbers to generate at the output thereof said fourth set of log-corrected least significant bits.

10. The encoding apparatus as defined in claim 9 wherein said log fixup means further includes a plurality of AND gates, each (a) having a first input for receiving the respective one of said correction numbers (b) having a second input which is a logical zero when said second set of numbers are all logical one's, and (c) having an output which is coupled to said combining means of said log fixup means to produce said fourth set of log-corrected least significant bits.

11. The encoding apparatus as defined in claim 1 further including means for decoding said m+1 bit output samples in the log domain to produce reconstructed samples representative of the antilogarithms of said output samples in the non-log domain; said decoding means comprising:

(A) means for tagging a logical one to said l least significant bits of said m+1 bit output samples to produce at an output thereof a fifth set of binary numbers having a logical one in the highest significant bit position thereof:

(B) means responsive to said m most significant bits of said m+1 bit output samples for determining a value representing the number of shifts toward the position of lesser significance of said fifth set of binary numbers necessary to define said reconstructed samples; and (C) means, coupled to said value determining means, for shifting said fifth set of binary numbers toward said position of lesser significance to produce said reconstructed samples in the non-log domain.

12. The encoding/decoding apparatus as defined in claim 11 wherein said value determining means comprises:

(A) means for subtracting said fixed binary value from said m most significant bits of said m+1 bit output samples; and (B) means for selectively inverting the output value of said subtracting means to generate said value representing the number of shifts of said fifth set of binary numbers required to form said reconstructed samples in the non-log domain.

13. The encoding/decoding apparatus as defined in claim 12 wherein said subtracting means comprises means for additng 2's complement of said fixed binary value to the m most significant bits of said output samples.

14. The encoding/decoding apparatus as defined in claim 12 wherein said selectively inverting means comprises a plurality of NAND gates, each (a) having as a first input the inverted value of the most significant bit of said output of said subtracting means, and (b) having as a second input the respective one of the remaining bits of said output of said subtracting means.

15. The encoding/decoding apparatus as defined in claim 11 wherein said value determining means comprises a plurality of NAND gages, each (a) having as a first input the highest significance bit of said m most significant bits of said m+1 bit output samples, and (b) having as a second input the respective one of the remaining bits of said m most significant bits.

16. The encoding/decoding apparatus as defined in claim 11 wherein said value determining means comprises means for inverting the m−1 least significant bits of the m most significant bits of said output samples.

17. The encoding apparatus as defined in claim 1 further including means for decoding said m+1 bit output samples in the log domain to produce reconstructed samples representative of the antilogarithms of said output samples in the non-log domain; said decoding means comprising:

(A) truncation fixup means responsive to said m most significant bits of said m+1 bit output samples for adding correction factors to said output samples to produce a sixth set of binary numbers such that said reconstructed samples are rounded off to the nearest integer;

(B) means, coupled to said truncation fixup means, for tagging a logical one the l least significant bits of said sixth set of binary numbers to produce a seventh set of binary numbers having a logical one in the highest significant bit position thereof;

(C) means responsive to the m most significant bits of said sixth set of binary numbers for determining a value representing the number of shifts toward the position of lesser significance of said seventh set of binary numbers necessary to form said reconstructed samples; and (D) means, coupled to said value determining means, for shifting said seventh set of binary numbers toward said position of lesser significance to produce said reconstructed samples in the non-log domain.

18. The encoding/decoding apparatus as defined inclaim 17 wherein said truncation fixup means comprises a ROM to which said m most significant bits of said output samples are applied as address codes, and which is programmed to contain the associated correction factors at the respective memory locations; wherein said truncation fixup means further includes means for combining said correction factors with said output samples to generate said sixth set of truncation-corrected binary numbers.

19. The encoding apparatus as defined in claim 8 further including means for decoding said m+1 bit log-corrected output samples in the log domain to produce reconstructed samples representative of the antilogarithms of said output samples in the non-log domain; said decoding means comprising:

(A) antilog fixup means responsive to said l least significant bits of said m+1 bit log-corrected output samples for modifying said l least significant bits thereof to adjust for the differences between said log-linear approximation and said logarithmic function to produce an eights set of binary log-linear output values;

(B) truncation fixup means responsive to the m most significant bits of said eights set of log-linear output values for adding respective correction factors thereto to produce a ninth set of binary numbers such that said reconstructed samples are rounded off to the nearest integer;

(C) means, coupled to said truncation fixup means, for tagging a logical one to the l least significant bits of said ninth set of binary numbers to produce a tenth set of binary numbers having a logical one in the highest significant bit position thereof;

(D) means responsive to the m most significant bits of said ninth set of binary numbers for determining a value representing the number of shifts toward the position of lesser significance of said tenth set of binary numbers necessary to form said reconstructed samples; and (E) means, coupled to said value determining means, for shifting said tenth set of binary numbers toward said position of lesser significance to produce said reconstructed samples in the non-log domain.

20. The encoding/decoding apparatus as defined in claim 19 wherein said antilog fixup means includes a ROM to which said l least significant bits of said log-corrected output samples are fed as address codes, and which is programmed to contain the log-linear values thereof at the respective memory locations; said antilog fixup means further having means for merging said m most significant bits of said log-corrected output samples with said log-linear values of said l least significant bits at the output of said antilog fixup ROM to generate said eight set of log-linear output values.

21. A digital signal processing apparatus for encoding n-bit binary input samples to produce m+1 bit binary output samples representative of a given logarithmic function of said input samples; each of said binary input samples being represented by n binary bits arranged in order of significance from a least significant bit position to a most significant bit position; each of said binary output samples being represented by m+1 binary bits arranged in order of significance from a least significant bit position to a most significant bit position; each of said bits exhibiting first and second states representing logical one's and logical zero's respectively; said encoding apparatus comprising:

(A) an input terminal for applying said n-bit binary input sampes;

(B) means, coupled to said input terminal, for determining a number r corresponding to the bit position of highest significance exhibiting a logical one state in the respective one of said input samples, and generating an equivalent binary value at an output thereof;

(C) selectively-actuated means, coupled to said bit position determining, for adding a predetermined value to said equivalent binary values for non-zero input samples to generate m-bit binary values representing the m most significant bits of said output samples;

(D) means, coupled to said input terminal, for generating the l-bit binary products of the n-r least significant bits of said input samples times 2r; and (E) means for concatenating said n-bit binary values with said l-bit binary products as the most and least significant bits respectively of said output samples.

22. The encoding apparatus as defined in claim 21 wherein said equivalent binary value at said output of said bit position determining means varies from 1 to n as said highest significance bit exhibiting a logical one state in said input samples shifts from said least signifcant bit position position to said most significant bit position position respectively; wherein said output of said bit position determining means is zero in the absence of a logical one in said input samples.

23. A digital signal processing apparatus for decoding m+1 bit binary samples in the log domain to produce reconstructed binary samples representative of the antilogarithms of said log samples; said binary log samples being represented by m+1 binary bits arranged in order of significance from a least significant bit position to a most significant bit position; each of said bits exhibiting first and second states representing logical one's and logical zero's respectively; the m most significant bits of said m+1 bit binary log samples representing the bit position of highest significance exhibiting a logical one state in said reconstructed samples in the non-log domain; said decoding apparatus comprising:

(A) truncation fixup means responsive to said m most significant bits of said m+1 bit binary log samples for adding correction factors to said binary log samples to produce a first set of binary numbers such that said reconstructed samples are rounded off to the nearest integer;

(B) means, coupled to said truncation fixup means, for tagging a logical one to the l least significant bits of said first set of binary numbers to produce a second set of binary numbers having a logical one in the highest significant bit position thereof;

(C) means responsive to the m most significant bits of said second set of binary numbers for determining a value representing the number of shifts toward the position of lesser significance of said second set of binary numbers necessary to form said reconstructed samples; and (D) means, coupled to said value determining means, for shifting said second set of binary numbers toward said position of lesser significance to produce said reconstructed samples in the non-log domain.

* * * * *

UNITED STATES PATENT AND TRADEMARK OFFICE
CERTIFICATE OF CORRECTION

PATENT NO. : 4,614,935
DATED : September 30, 1986
INVENTOR(S) : Russell Thomas Fling It is certified that error appears in the above-identified patent and that said Letters Patent is hereby corrected as shown below:

Column 2, line 5, that portion reading "$B=antilog_{10}[2/(2N-1)log_{10}(2M-1)]$" should read -- $B=antilog_{10}[2/(2^N-1)log_{10}(2^M-1)]$ --;

Column 3, line 10, that portion reading "Fig. 1 in" should read -- Fig. 1 shows, in --;

Column 3, line 11, before "log" insert -- employing the --;

Column 4, line 15, that portion reading "shifter" (second occurrence) should read -- shifts --;

Column 12, line 33, that portion reading "additing" should read -- adding --;

Column 12, line 45, that portion reading "gages" should read -- gates --;

Column 14, line 30, that portion reading "2r" should read -- $2^r$ --;

UNITED STATES PATENT AND TRADEMARK OFFICE
CERTIFICATE OF CORRECTION

PATENT NO. : 4,614,935

DATED : September 30, 1986

INVENTOR(S) : Russell Thomas Fling

It is certified that error appears in the above-identified patent and that said Letters Patent is hereby corrected as shown below:

Column 14, line 31, that portion read "n-bit" should read -- m-bit --.

Signed and Sealed this

Twentieth Day of January, 1987

Attest:

DONALD J. QUIGG

*Attesting Officer*      *Commissioner of Patents and Trademarks*